(12) United States Patent
Wegmann

(10) Patent No.: US 8,004,690 B2
(45) Date of Patent: Aug. 23, 2011

(54) DEVICE AND METHOD FOR THE OPTICAL MEASUREMENT OF AN OPTICAL SYSTEM, MEASUREMENT STRUCTURE SUPPORT, AND MICROLITHOGRAPHIC PROJECTION EXPOSURE APPARATUS

(75) Inventor: Ulrich Wegmann, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 727 days.

(21) Appl. No.: 10/585,402

(22) PCT Filed: Jan. 12, 2005

(86) PCT No.: PCT/EP2005/000184
§ 371 (c)(1),
(2), (4) Date: Dec. 19, 2008

(87) PCT Pub. No.: WO2005/069080
PCT Pub. Date: Jul. 28, 2005

(65) Prior Publication Data
US 2009/0116036 A1    May 7, 2009

(30) Foreign Application Priority Data
Jan. 16, 2004    (DE) .......................... 10 2004 003 585

(51) Int. Cl.
*G01B 9/02* (2006.01)
*G03B 27/42* (2006.01)

(52) U.S. Cl. .......................................... 356/521; 355/53
(58) Field of Classification Search .................. 356/521; 355/53
See application file for complete search history.

(56) References Cited

U.S. PATENT DOCUMENTS

| | | | |
|---|---|---|---|
| 5,978,085 A | 11/1999 | Smith et al. | |
| 6,278,514 B1 * | 8/2001 | Ohsaki | 355/55 |
| 6,819,414 B1 | 11/2004 | Takeuchi | |
| 7,081,962 B2 * | 7/2006 | Nakauchi | 356/521 |
| 7,158,237 B2 * | 1/2007 | Schriever et al. | 356/515 |
| 7,286,245 B2 * | 10/2007 | Wegmann et al. | 356/521 |
| 7,295,327 B2 * | 11/2007 | Ohkubo | 356/515 |
| 7,304,749 B2 * | 12/2007 | Ohkubo | 356/521 |

(Continued)

FOREIGN PATENT DOCUMENTS

| | | |
|---|---|---|
| DE | 101 09 929 A1 | 11/2001 |
| DE | 10109929 A1 | 11/2001 |
| DE | 10105958 A1 | 9/2002 |
| EP | 1 079 223 A | 2/2001 |
| EP | 1079223 A1 | 2/2001 |
| EP | 1 439 427 A | 7/2004 |
| EP | 1439427 A2 | 7/2004 |
| WO | 99/60361 A1 | 11/1999 |
| WO | WO 2004057295 A2 | 7/2004 |
| WO | WO 2004/090490 A | 10/2004 |
| WO | WO 2004090490 A1 | 10/2004 |
| WO | WO 2004/099877 A | 11/2004 |

*Primary Examiner* — Patrick J Connolly
(74) *Attorney, Agent, or Firm* — Sughrue Mion, PLLC

(57) ABSTRACT

A device for the optical measurement of an optical system which, in a useful operating mode, receives useful radiation on a useful radiation entrance side and emits it on a useful radiation exit side. The device includes a measurement radiation source, by which at least one exit-side element, which emits measurement radiation to the optical system, can be positioned on the useful radiation exit side of the optical system, and a detector, by which at least one entrance-side element, which receives measurement radiation coming from the optical system, can be positioned on the useful radiation entrance side of the optical system. The measurement radiation source includes a source-side measurement structure mask for positioning on the useful radiation exit side and/or the detector includes a detector-side measurement structure mask for positioning on the useful radiation entrance side. Also provided are a measurement structure support that can be used for such a device, a microlithography projection exposure apparatus equipped with such a device, and an associated method. The device can be used, e.g., for the wavefront measurement of projection objectives of microlithography projection exposure apparatuses.

24 Claims, 9 Drawing Sheets

U.S. PATENT DOCUMENTS

Figure 1:
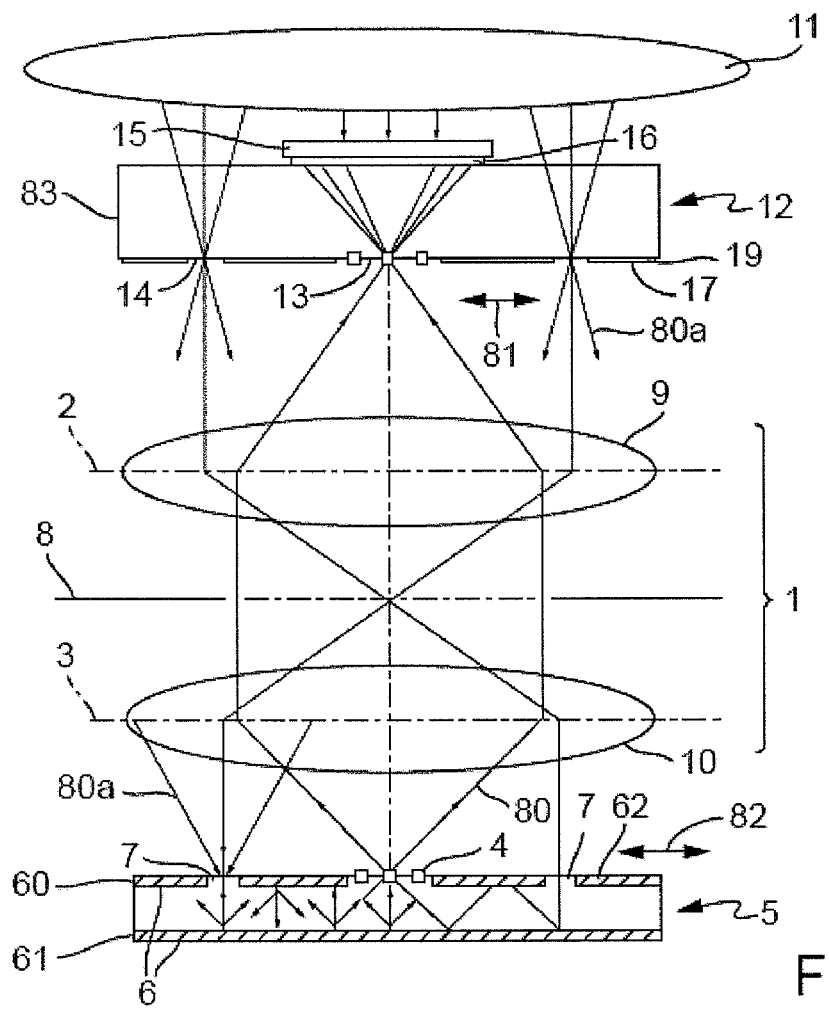

| | | | |
|---|---|---|---|
| 7,365,861 B2* | 4/2008 | Wegmann | 356/515 |
| 7,417,745 B2* | 8/2008 | Haidner et al. | 356/515 |
| 7,436,521 B2* | 10/2008 | Emer et al. | 356/521 |
| 7,760,366 B2* | 7/2010 | Mengel et al. | 356/515 |
| 2002/0001088 A1 | 1/2002 | Wegmann et al. | |
| 2002/0118370 A1 | 8/2002 | Nishida | |
| 2006/0262323 A1* | 11/2006 | Yamamoto | 356/515 |
| 2008/0180688 A1* | 7/2008 | Mengel et al. | 356/515 |
| 2008/0252876 A1* | 10/2008 | Mengel et al. | 356/51 |
| 2009/0116036 A1* | 5/2009 | Wegmann | 356/521 |
| 2009/0296059 A1* | 12/2009 | Suzuki et al. | 355/55 |
| 2010/0002243 A1* | 1/2010 | Aizawa et al. | 356/521 |
| 2010/0026977 A1* | 2/2010 | Yamamoto | 355/67 |
| 2010/0068634 A1* | 3/2010 | Suzuki et al. | 430/30 |
| 2010/0112733 A1* | 5/2010 | Furukawa | 438/16 |
| 2010/0177323 A1* | 7/2010 | Ouchi | 356/520 |

* cited by examiner

DEVICE AND METHOD FOR THE OPTICAL MEASUREMENT OF AN OPTICAL SYSTEM, MEASUREMENT STRUCTURE SUPPORT, AND MICROLITHOGRAPHIC PROJECTION EXPOSURE APPARATUS

This is a National Stage of International Application No. PCT/EP2005/000184 filed Jan. 12, 2005.

The invention relates to a device for the optical measurement of an optical system which, in a useful operating mode, receives useful radiation on a useful radiation entrance side and emits it on a useful radiation exit side, comprising a measurement radiation source, by which at least one exit-side element which emits measurement radiation to the optical system can be positioned on the useful radiation exit side of the optical system, and a detector, by which at least one entrance-side element which receives measurement radiation coming from the optical system can be positioned on the useful radiation entrance side of the optical system to a measurement structure support that can be used for such a device, to a microlithography projection exposure apparatus equipped with such a device, and to an associated method.

Devices for the measurement of optical systems, such as optical imaging systems, are variously known. In the useful operating mode of the optical system, useful radiation passes in a useful radiation direction e.g. from an illuminated object on the useful radiation entrance side, that is to say on the object side, to the optical system, passes through the latter and emerges from said optical system on the useful radiation exit side, that is to say on the image side.

For measurement of the optical system, e.g. with regard to imaging aberrations in the case of an imaging system, such as a projection objective for microlithography, it is operated in a measurement operating mode. In this operating mode, usually a measurement radiation source for emitting measurement radiation is positioned on the object side and a detector for receiving the measurement radiation is positioned on the image side. In this case, a single radiation generating unit may be provided for the measurement radiation source in the measurement operating mode, on the one hand, and for a useful radiation source in the useful operating mode, on the other hand.

The published patent application DE 101 09 929 A1 describes a device for the wavefront measurement of an optical system, which device comprises, as measurement radiation source, a wavefront source which is to be positioned on the object side and has a two-dimensional source-side measurement structure mask for generating a wavefront which passes through the optical system, while a detector comprising a diffraction grating behind the optical system and a spatially resolving detector element arranged downstream of the diffraction grating is provided on the image side. A shearing interferometry technique in which the diffraction grating is displaced laterally is used for wavefront measurement. Wavefront measurement devices which use other measuring techniques, such as point diffraction interferometry, Moiré methods and Shack-Hartmann methods are customary as an alternative. In this case, the radiation used for the measurement may be identical to the useful radiation used during normal operation of the optical system.

One important area of application is the measurement of projection objectives in lithography exposure apparatuses, such as corresponding steppers or scanners, at their site of use. It has already been proposed for this purpose to integrate the measurement radiation source at least partly, in particular an associated measurement structure mask, into a reticle or to introduce it into the apparatus in exchange for a reticle with a conventional reticle stage, and/or to integrate the detector at least partly into a wafer stage or to introduce it into the apparatus in exchange for a wafer with the wafer stage. When the detector is integrated into a wafer stage, there is the difficulty that only relatively little structural space is available and heat emitted by the detector, in particular electronic components thereof, can influence the overlying projection objective.

In the case of a Shack-Hartmann measuring method as described in the patent specification U.S. Pat. No. 5,978,085, use is made of a complex measurement reticle whose structures are exposed on a detector wafer coated with a photo resist. The evaluation is effected by measuring the structures produced on the detector wafer outside the exposure apparatus by means of suitable measuring apparatuses. This procedure is comparatively time-consuming.

The patent specification U.S. Pat. No. 6,278,514 B1 describes a projection exposure apparatus into which is integrated a device for determining wavefront aberrations which operates on the basis of a double passage method. For this purpose, it comprises a beam-deflecting device, e.g. a mirror, which is integrated into a wafer stage alongside a wafer holding region and reflects light coming from the projection objective back to the latter, so that it passes through the projection objective a second time on the same light path but in the opposite direction. The light is subsequently coupled out laterally in the direction of a detector element by means of a semitransparent mirror arranged between a reticle plane and the projection objective.

The published patent application WO 2004/057295 A2 and a corresponding U.S. patent application by the applicant describe devices and methods for the optical measurement of an optical system, such as a microlithography projection objective, which operate with an immersion fluid which can be introduced adjacent to at least one of one or a plurality of object-side and/or one or a plurality of image-side components of the measurement device, for example by corresponding interspaces between successive optical components in the beam path being configured as immersion fluid chambers. The content of these two documents is incorporated by reference herein in its entirety with regard to this immersion fluid subject matter, in order to avoid unnecessary text repetitions.

The technical problem on which the invention is based is that of providing a device of the type mentioned in the introduction for the measurement of an optical system, which device affords functional and technical handling advantages, in particular during the measurement of projection objectives in lithography exposure apparatuses, and can also be retrofitted in such exposure apparatuses for this purpose. Furthermore, the intention is to provide a measurement structure support suitable for this and a microlithography projection exposure apparatus equipped with such a device.

The invention solves this problem by the provision of a device for the optical measurement of an optical system which, in a useful operating mode, receives useful radiation on a useful radiation entrance side and emits it on a useful radiation exit side, including:

a measurement radiation source, by which at least one exit-side element which emits measurement radiation to the optical system can be positioned on the useful radiation exit side of the optical system, and a detector, by which at least one entrance-side element which receives measurement radiation coming from the optical system can be positioned on the useful radiation entrance side of the optical system, wherein at least one of the following conditions are met: (a) the measurement radiation source comprises a source-side measurement structure mask for positioning on the useful radiation exit side, and (b) the detector comprises a detector-side measurement structure mask for positioning on the useful radiation entrance side.

The invention further encompasses a measurement structure support for an optical measurement device, including:

a transparent support body, on the front side of which is provided a measurement structure mask which is operable in transmission and comprises a measurement structure region and into which is integrated a measurement radiation conversion device for the rear-side illumination of the measurement structure region, and a passage region coupling measurement radiation into the support body provided on a face side of the measurement structure support, the face side being on at least one of: (a) a front side outside the measurement structure region of the measurement structure mask, and (b) a rear side.

The invention is further directed to a microlithography projection exposure apparatus provided with an optical measurement device in accordance with the invention. The invention additionally encompasses a method for the optical measurement of an optical system which, in a useful operating mode, receives useful radiation on a useful radiation entrance side and emits the radiation on a useful radiation exit side, the method being performed with measurement radiation in a measurement operating mode and including:

at least one of: (a) positioning a source-side measurement structure mask of a measurement radiation source on the useful radiation exit side and (b) positioning a detector-side measurement structure mask of a detector on the useful radiation entrance side, and carrying out a measurement operation by emitting measurement radiation provided by the measurement radiation source to the optical system on the useful radiation exit side and receiving measurement radiation coming from the optical system on the useful radiation entrance side for detecting the radiation.

In the case of a device according to one formulation of the invention, the measurement radiation source includes a source-side measurement structure mask for positioning on the useful radiation exit side and/or the detector includes a detector-side measurement structure mask for positioning on the useful radiation entrance side. Accordingly, in measurement operation the measurement radiation passes through the optical system in a direction opposite to the direction in which the useful radiation passes through the optical system in useful operation. By means of this beam guiding of the measurement radiation in an opposite direction relative to useful operation, it is possible, in particular, during the measurement of projection objectives in lithography exposure apparatuses to completely or partially avoid the aforementioned difficulties of conventional devices in which the measurement radiation in measurement operation is passed through the projection objective in the same direction as the useful radiation in useful operation. Thus, there is no need to arrange a detector component in the possibly confined image-side region, and already existing apparatuses such as wafer stepper and wafer scanner systems can be retrofitted with this device relatively simply in a manner largely independent of type. For this purpose, the components of the measurement radiation source can be arranged completely or partly on the image side; in particular, the source-side measurement structure mask can be introduced e.g. by way of a wafer stage. The components of the detector can be arranged completely or partly on the object side; in particular, the detector-side measurement structure mask can be positioned on the object side e.g. in a reticle plane of the objective.

In the case of a development of the invention, the measurement radiation source is designed for rear-side illumination of the source-side measurement structure mask, the source-side measurement structure mask being designed for operation in transmission, and the measurement radiation source comprising a measurement radiation conversion device in the beam path of the measurement radiation upstream of the source-side measurement structure mask. The measurement radiation conversion device is expediently formed in such a way that the measurement radiation illuminates the source-side measurement structure mask largely homogeneously, incoherently and completely with regard to intensity and direction. A homogeneous distribution of the measurement beam directions brings about a uniform or at least only slowly varying illumination of the pupil, and a homogeneous distribution of the intensity on the source-side measurement structure mask brings about a homogeneous intensity distribution on the detector-side measurement structure mask.

In the case of the device according to a further development, the measurement radiation conversion device has one or a plurality of light-deflecting elements and/or one or a plurality of light-scattering elements. By way of example, rough surfaces, microprisms or diffraction gratings may serve as light-scattering elements. The reflecting elements may be realized e.g. as optical waveguides, prisms or mirrors and, by means of low-loss multiple reflections increase the proficiency of the beam conversion both with regard to quantity of light and with regard to intermixing. Such reflecting and light-scattering structures are simple and cost-effective to produce.

In another development of the device, the measurement radiation source comprises a beam-generating unit for positioning on the useful radiation entrance side and the detector-side measurement structure mask has, outside a measurement structure region, a passage region for the measurement radiation. The measurement radiation can traverse the detector through the passage region and pass from the beam-generating unit to the source-side measurement structure mask. The beam-generating unit used may in this case be in particular the one which supplies the useful radiation during useful operation of the optical system.

In the case of a further development of the device, the source-side measurement structure mask has a passage region outside a measurement structure region in order to pass through measurement radiation emitted by a beam-generating unit for the rear-side illumination of the measurement structure region. This may be supported by a beam-deflecting device which deflects the measurement radiation passed through to the measurement structure region.

In the case of a further development of the device, the measurement radiation source is designed for the front-side illumination of the source-side measurement structure mask, the source-side measurement structure mask being designed for operation in reflection. This may be useful in particular when measurement radiation having wavelengths in the EUV range, that is to say of less than 100 nm, is used. In a further refinement, a measurement structure region of the source-side measurement structure mask has scattering regions, on the one hand, and reflecting and/or absorbing regions on the other hand. The scattering regions of the measurement structure mask operating in reflection correspond to transparent regions of a measurement structure mask operating in transmission and the regions which reflect and/or absorb outside the aperture angle correspond to opaque regions of said mask.

The device according to a further refinement has a measurement radiation guiding device for laterally feeding the measurement radiation emitted by a beam-generating unit into a region in front of or behind the source-side measurement structure mask. The measurement radiation guiding device used may be e.g. mirror segments which are formed in such a way that they have both a focusing effect and a scattering effect. Shallow angles of incidence making use of total reflection are advantageous in the case of short-wave radiation in the EUV range. Refractive focusing optics or optical waveguides may also be used for the lateral feeding. A beam-generating unit which is simple and cost-effective to produce may suffice for providing the laterally fed measurement radiation.

In another development of the device according, the detector has a detector support to be arranged on the useful radiation entrance side of the optical system, said detector support bearing the detector-side measurement structure mask and a detector element arranged downstream. The detector support may be arranged such that it can be displaced laterally as required, e.g. in order to carry out a wavefront measurement by means of shearing interferometry. The detector element may be an optoelectronic unit suitable for fast registering, e.g. a CCD unit, CMOS unit or CID unit, or a unit that measures the light intensity photochemically and in spatially dependent fashion. The electronic components required may be realized in a very flat design.

In a further development of the device, the detector support bears a detector power supply unit. As a result, the detector may be embodied as an autonomous mobile unit which can be positioned on the useful radiation entrance side of the optical system. The detector support may optionally also have an imaging optic, a camera, an electronic control unit, an image memory and/or a wire-free communication unit.

In another development of the device, an immersion fluid can be introduced into or adjacent to the measurement radiation source and/or into or adjacent to the detector, so that advantages associated with this can be utilized.

The measurement structure support according to the invention has a transparent support body, on the front side of which is provided a measurement structure mask which is operable in transmission and comprises a measurement structure region and into which is integrated a measurement radiation conversion device for the rear-side illumination of the measurement structure region, the measurement structure support having on a face side, on a front side outside the measurement structure region of the measurement structure mask and/or on a rear side a passage region for coupling measurement radiation into the support body. The measurement structure support may be embodied as a plate, for example, which comprises transparent material and bears the measurement structure mask on one side. The measurement structure support with the measurement structure mask may be arranged in laterally displaceable fashion as required, for example if the intension is to carry out a wavefront measurement by means of a shearing interferometry technique.

In a development of the measurement structure support, the measurement radiation conversion device comprises reflecting and/or light-scattering regions on the front side and/or the rear side of the support body or in the interior of the support body. The reflecting regions can be used for directing light and, through multiple reflection for homogenizing the measurement radiation. Light-scattering regions can easily be provided in sufficient number and proximity to the measurement structure mask in order to enable an as far as possible homogeneous illumination thereof, if desired.

In a further development of the measurement structure support, the measurement radiation conversion device has, below the measurement structure region, a first beam-deflecting area for deflecting the measurement radiation onto the rear side of the measurement structure region. When the measurement radiation is coupled in laterally through the face side of the measurement structure support, the beam-deflecting area can effect a targeted deflection onto the measurement structure region.

In another development of the measurement structure support, the measurement radiation conversion device comprises a second beam-deflecting area for deflecting measurement radiation incident on the front side and/or on the rear side at a passage region into the measurement structure support onto the first beam-deflecting area. A high luminous efficiency can be achieved by means of the targeted deflection with two beam-deflecting areas.

In a further development of the measurement structure support, the measurement radiation conversion device includes a beam-shaping optic. The latter likewise enables the luminous efficiency to be increased. Moreover, the measurement radiation can be focused onto a passage region by means of the beam-shaping optic, in such a way that the passage region can have small dimensions.

In another development of the invention, the measurement structure support is realized in such a way that an immersion fluid can be introduced into it with the known attendant advantages.

In a further development of the device, the measurement radiation source thereof includes a measurement structure support according to the invention.

The device according to a further refinement of the invention is designed for the wavefront measurement of a lithography projection objective, the source-side measurement structure mask being arranged on an image side of the projection objective and/or the detector-side measurement structure mask being arranged on an object side of the projection objective and the detector detecting an image of the source-side measurement structure mask or a superimposition pattern of the image of the source-side measurement structure mask with the detector-side measurement structure mask. On the object side, especially in the vicinity of the reticle plane, compared with the conventional positioning on the image side, there is sufficient structural space for the detector components with a reduced thermal load for the objective. The measurement radiation source with the source-side measurement structure mask may be configured like a wafer, that is to say with a thickness e.g. of less than 1 mm, and be handled like a wafer in a wafer stage. It does not need to be integrated into the wafer stage. The detector component with the detector-side measurement structure mask may be integrated in the reticle stage or be configured as a mobile reticle-like unit which can be introduced into the reticle stage. If the detector has a camera as detector element, the waste heat generated by the camera electronics rises upward, so that the projection objective arranged below the detector is not influenced by the waste heat, but rather at most by a certain thermal radiation. Since reticles that can be positioned on the object side typically have a thickness of approximately 6 mm to 11 mm and thus a significantly greater stability than image-side wafers, a registering detector element can be fitted relatively easily here.

The device according to another refinement is designed for a wavefront measurement by means of a shearing interferometry technique or a point diffraction interferometry technique or a Moiré superimposition technique. All three techniques can be used alone or in combination. In the case of point diffraction interferometry, the source-side measurement structure mask includes a pinhole. In the case of the shearing interferometry technique, the source-side measurement structure mask is normally a coherence mask whereas the detector-side measurement structure mask is normally a diffraction grating.

The measurement device according to the invention is advantageously integrated in the case of the exposure apparatus. The requirements made of the planarity of the diffraction grating tend to be less stringent on the object side than on the image side since the imaging scale of a projection objective for microlithography is normally less than one e.g. 0.25. The diffracting structures of the diffraction grating may also turn out to be larger by the reciprocal of the imaging scale, that is to say for example by the factor four, in the case of an object-side positioning than in the case of an image-side positioning. The structures can therefore be written using simpler devices or can be reproduced inexpensively with good quality as simple contact copies from a master original. This is advantageous particularly in cases in which the source-side measurement structure mask does not have such fine structures and can therefore still be produced relatively simply with structures decreased in size by the imagining scale. The source-side and/or the detector-side measurement structure mask may be embodied in laterally displaceable fashion for the purpose of carrying out the measurement techniques mentioned above.

The exposure apparatus may be, e.g., an apparatus of the scanner type, in which case, the measurement radiation serving for the measurement and the useful radiation serving for the exposure may be supplied by a common or a dedicated radiation generating unit.

The procedure in accordance with the method according to the invention may be adopted for the measurement of an optical system, in which case the device according to the invention, in particular, may be used.

Advantageous embodiments of the invention are illustrated in the drawings and are described below. In the figures:

FIG. 1 shows a schematic side view of a device for the wavefront measurement of an optical imaging system comprising an object-side detector and a measurement radiation source with object-side radiation generation and an image-side measurement structure mask.

Figure 2:
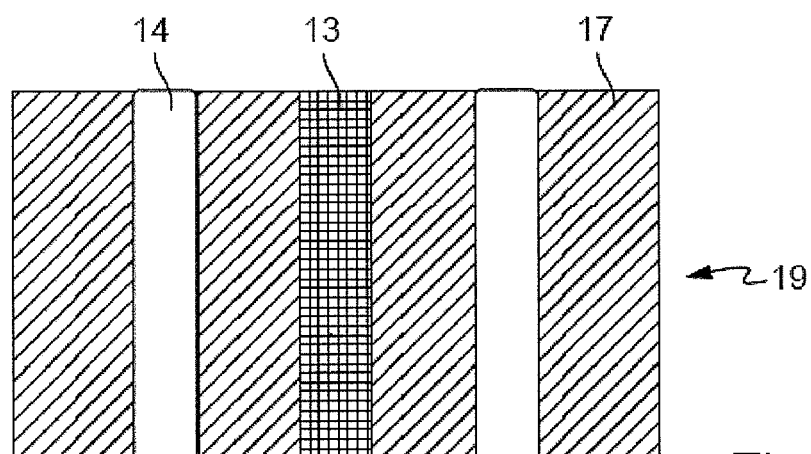
Figure 3:
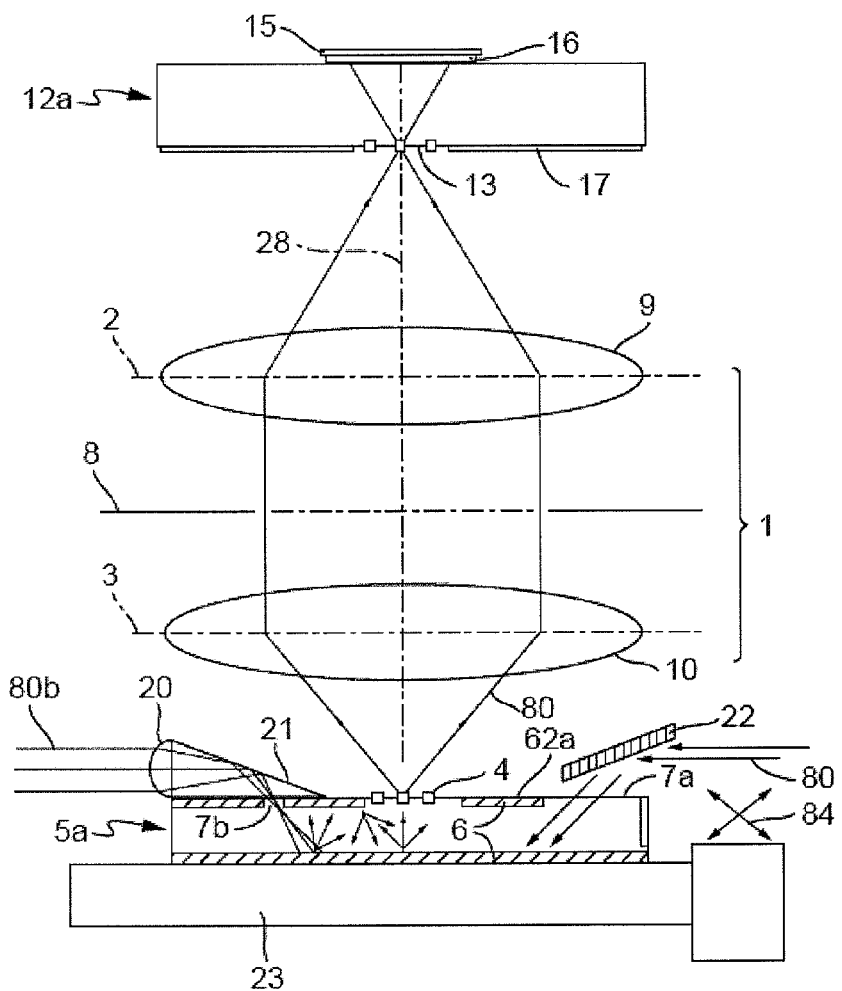
Figure 4:
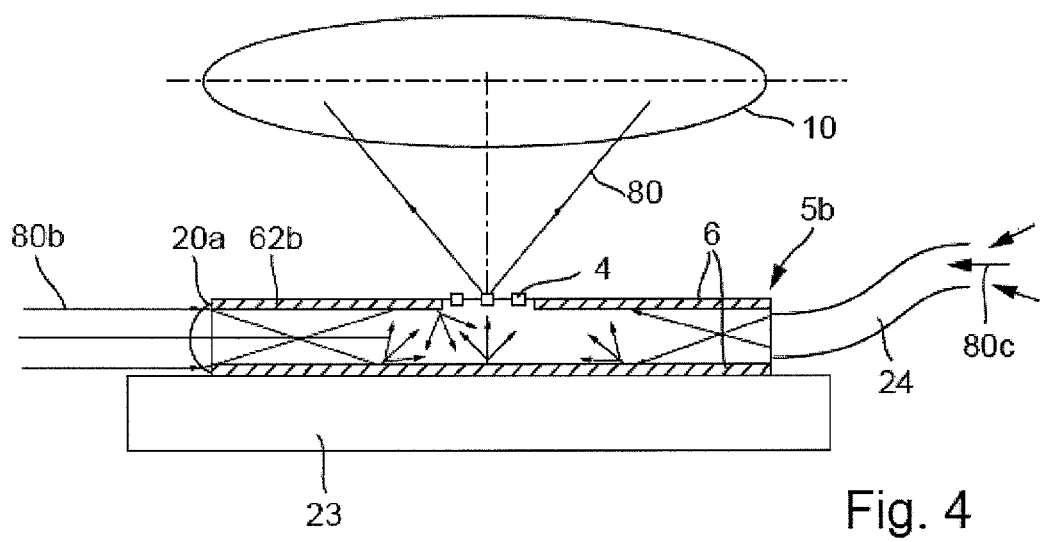
Figure 5:
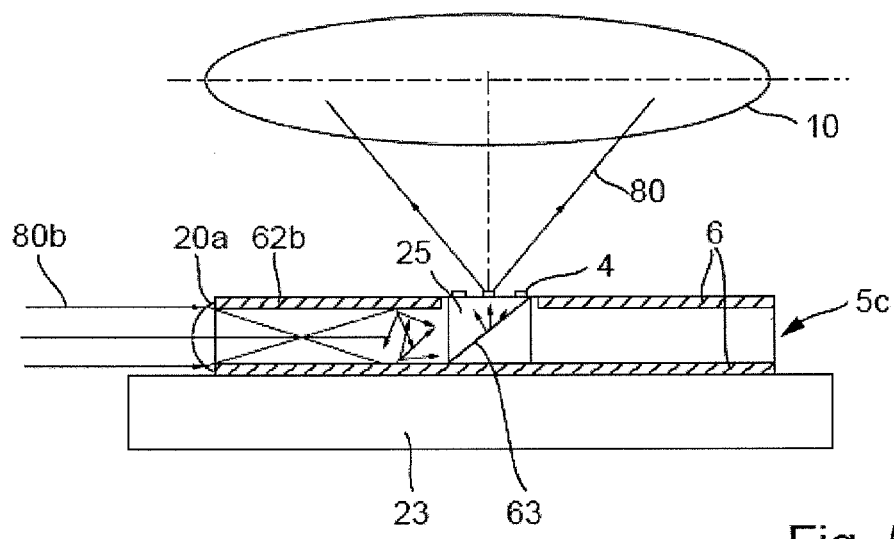
Figure 6:
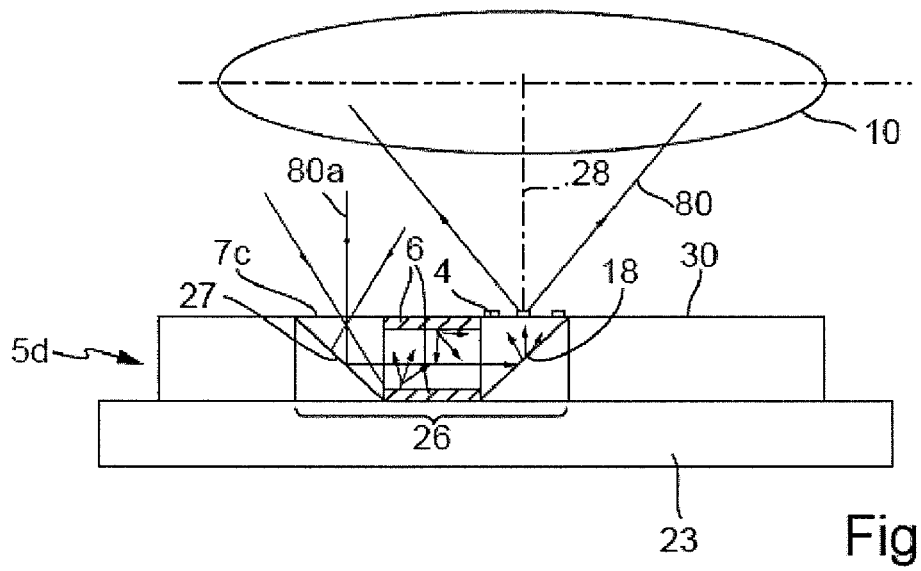
Figure 7:
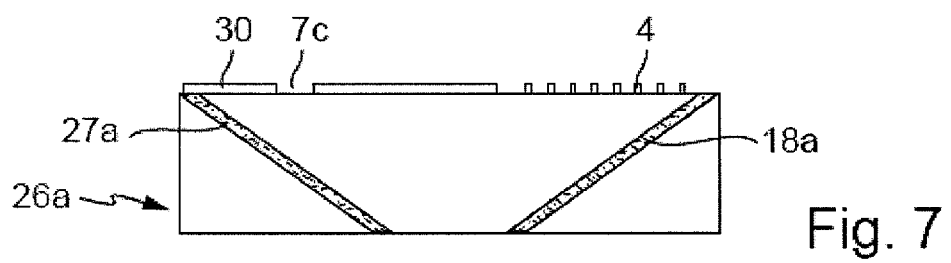
Figure 8:
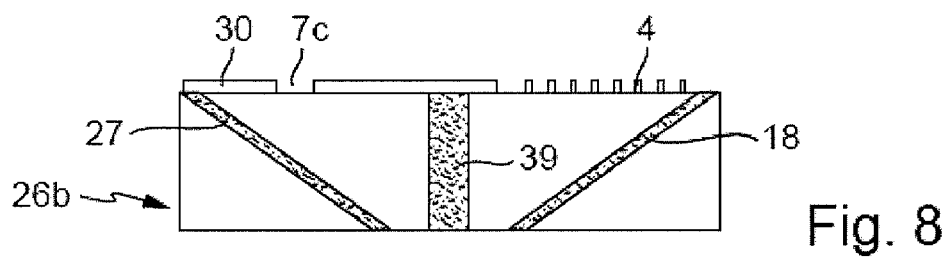
Figure 9:
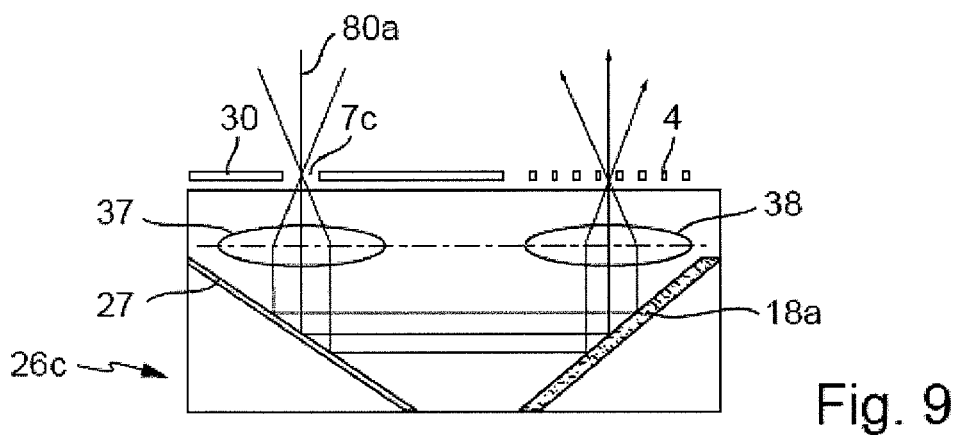
Figure 10:
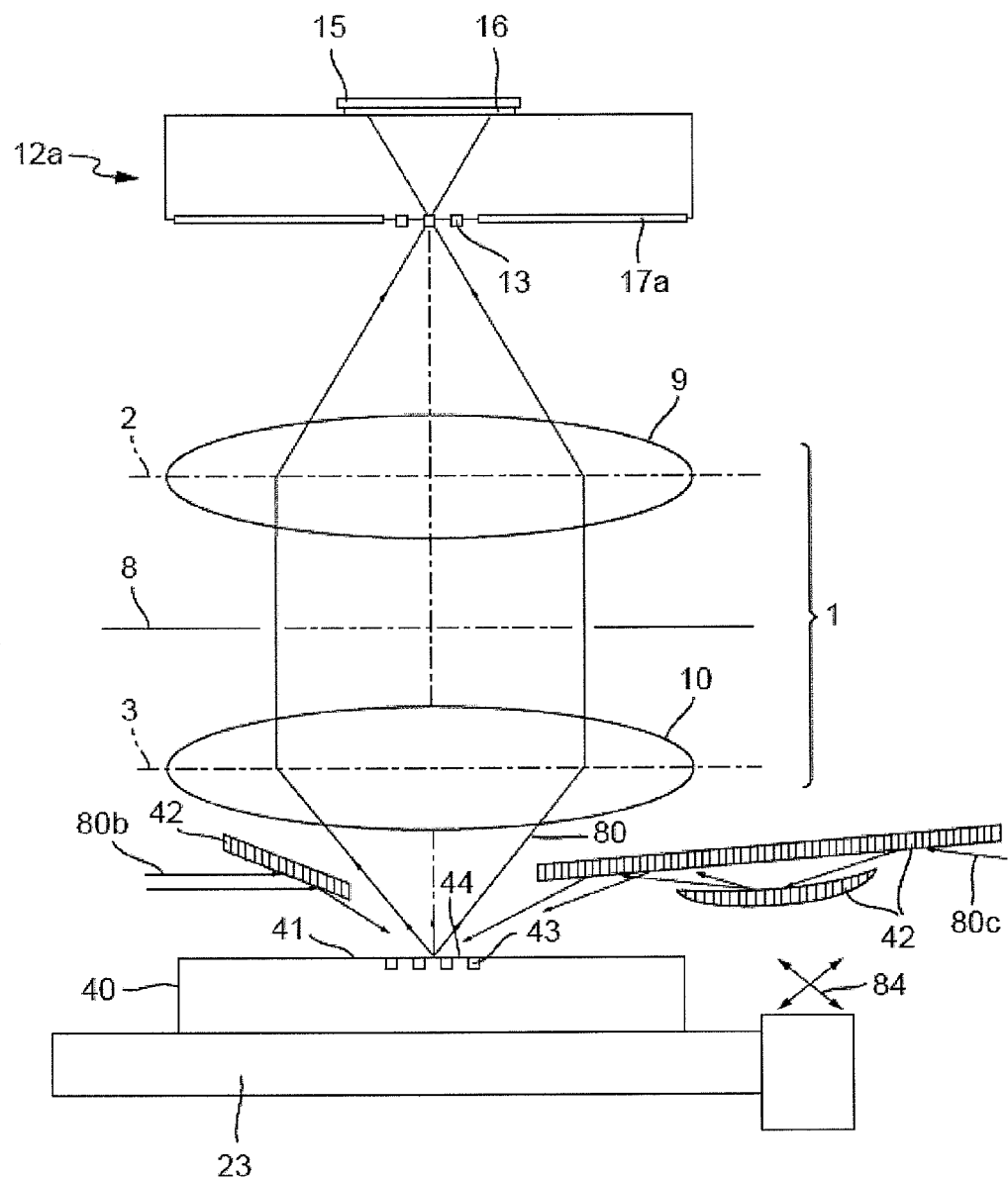
Figure 11:
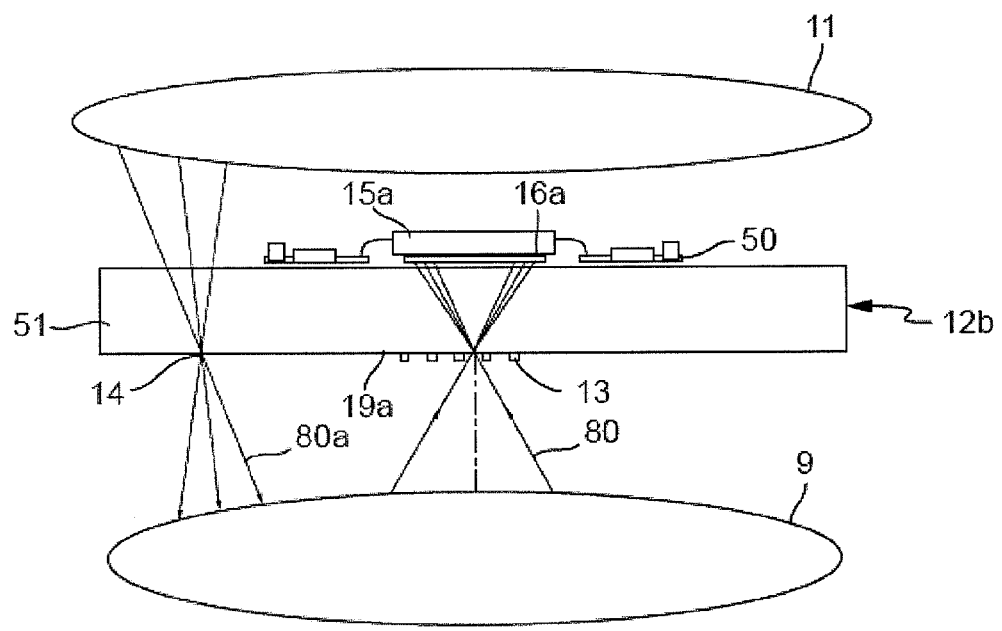
Figure 12:
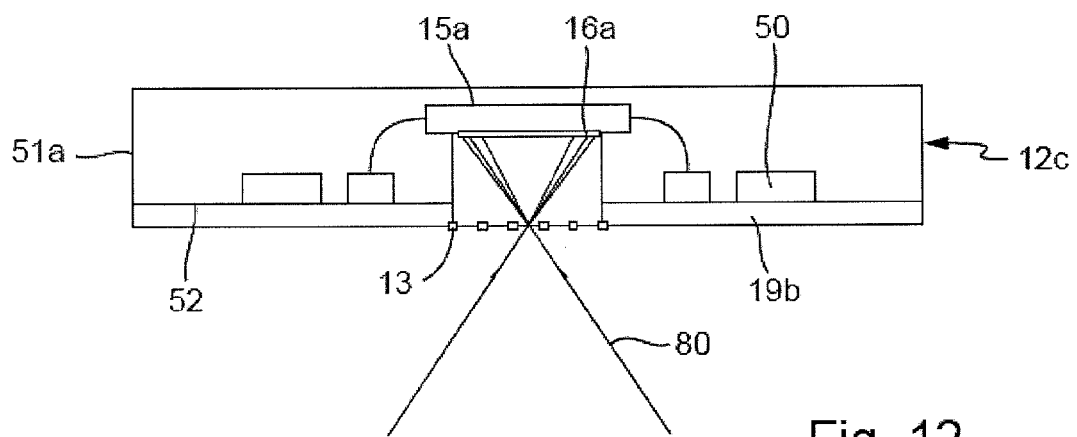
Figure 13:
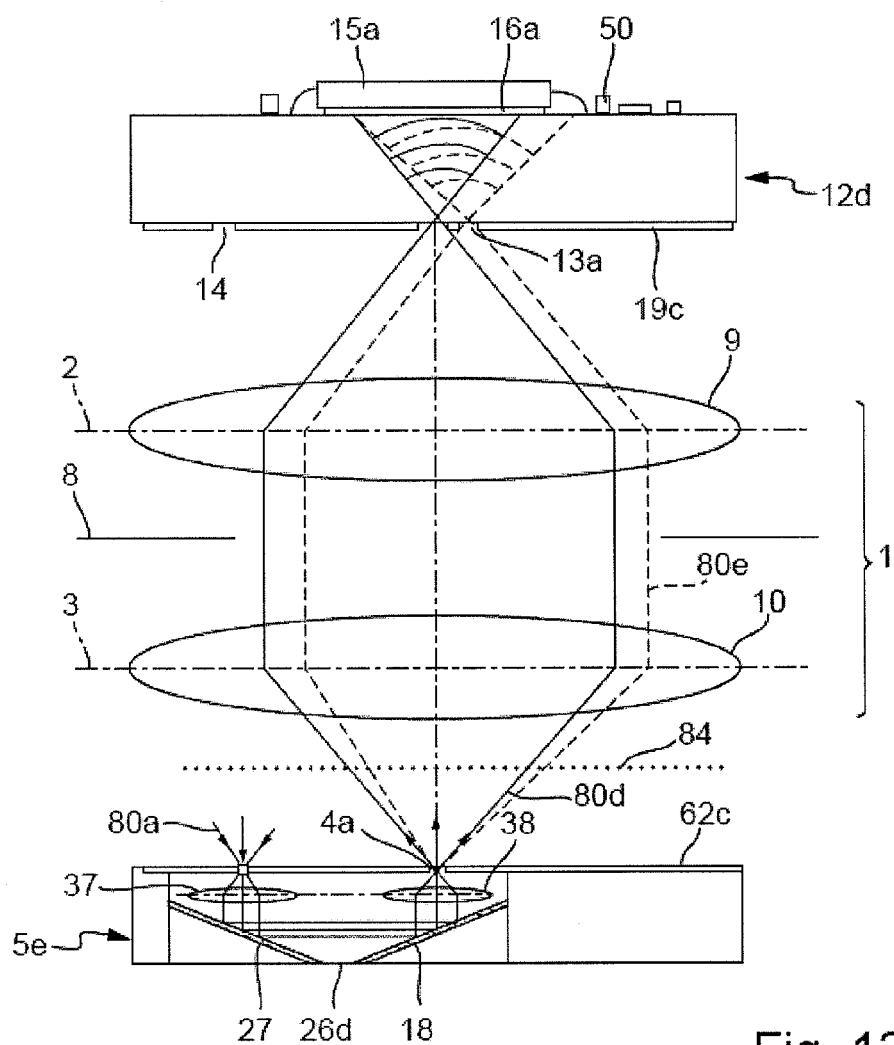
Figure 14:
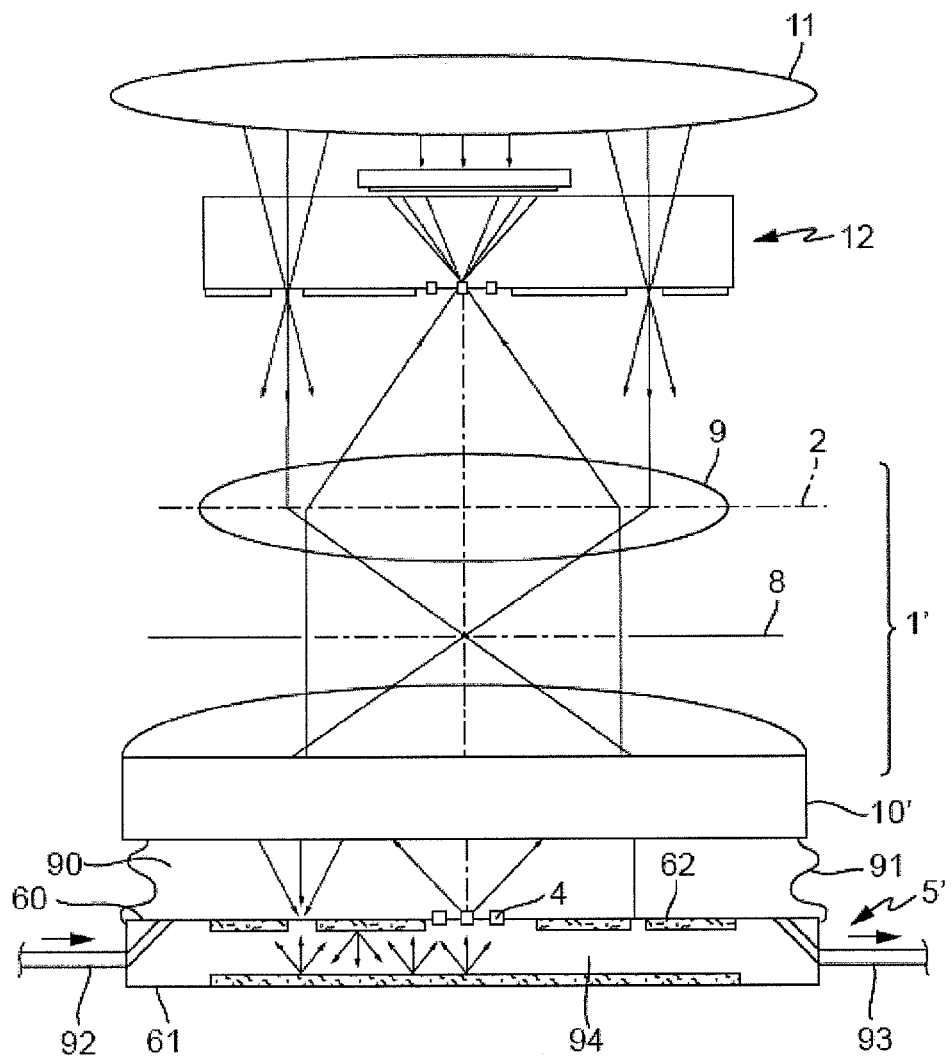
Figure 15:
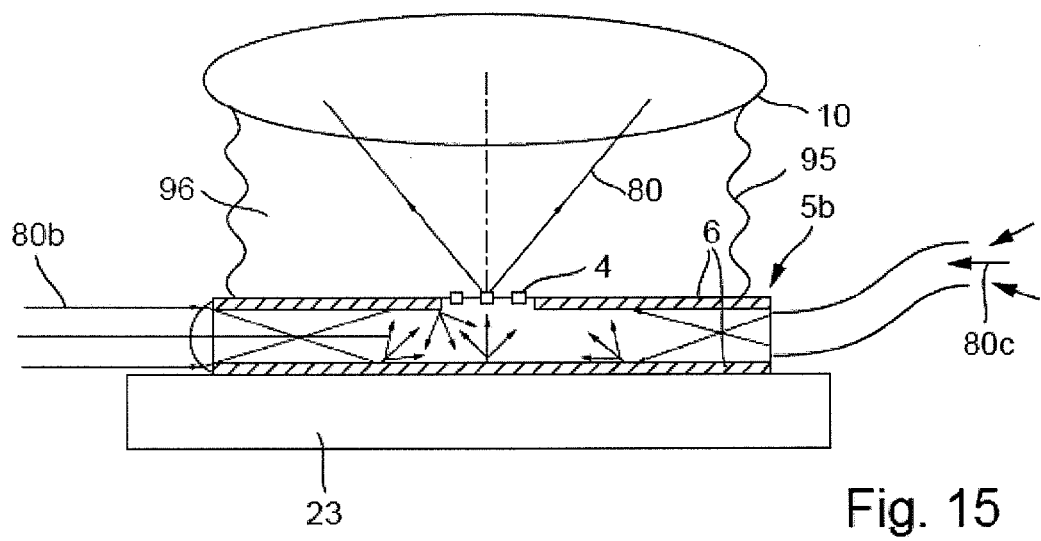
Figure 16:
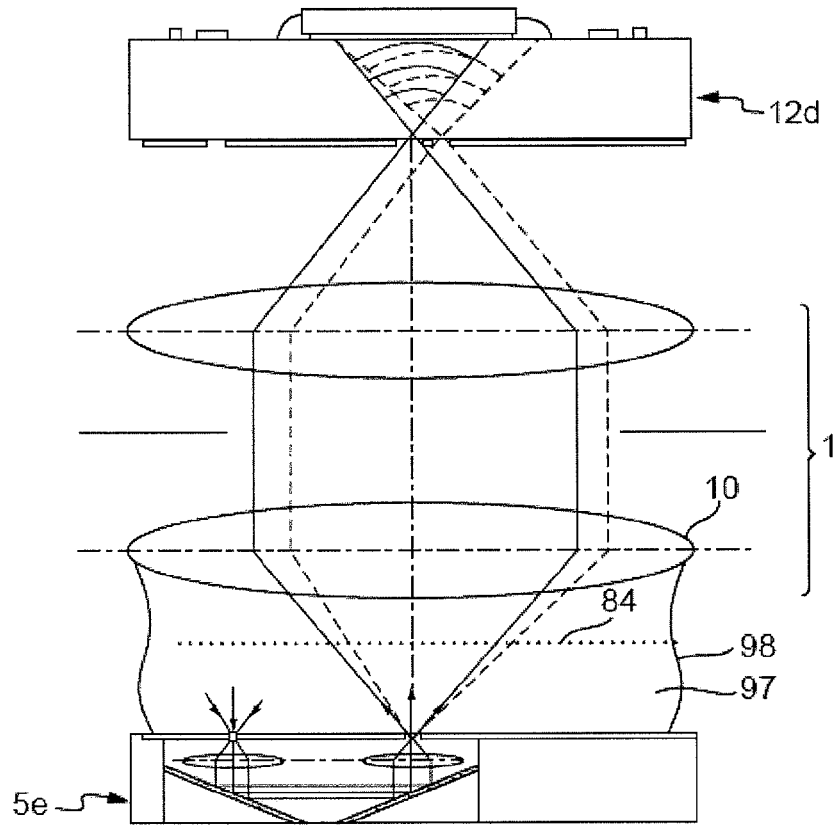

FIG. 2 shows a schematic plan view of a measurement structure mask for the detector from FIG. 1, FIG. 3 shows a schematic side view of a variant of the device from FIG. 1 for wavefront measurement comprising a measurement radiation source with lateral measurement beam coupling-in at a front side of an image-side measurement structure mask, FIG. 4 shows a schematic detail side view of a variant of the measurement radiation source from FIG. 3 with face-side lateral measurement beam coupling-in into a measurement structure support, FIG. 5 shows a view of a variant of the measurement radiation source from FIG. 4 with a deflection mirror, FIG. 6 shows a view of a further variant of the measurement radiation source from FIG. 4 with two deflection mirrors and front-side measurement beam coupling-in, FIG. 7 shows a schematic detail side view of a variant of the measurement radiation source from FIG. 6 with two deflection mirrors with a scattering function, FIG. 8 shows a view corresponding to FIG. 7 for a variant of a measurement radiation source with a scattering structure between the two deflection mirrors, FIG. 9 shows a view corresponding to FIG. 7 for a further variant of a measurement radiation source with two deflection mirrors and a beam-shaping optic, FIG. 10 shows a schematic side view of a variant of the device from FIG. 3 for wavefront measurement with a source-side measurement structure mask operated in reflection, FIG. 11 shows a schematic side view of a variant of the detector from FIG. 1 with an integrated power supply, FIG. 12 shows a schematic side view of a variant of the detector from FIG. 11 with a quartz support, FIG. 13 shows a schematic side view of a device for the wavefront measurement of an optical imaging system by means of point diffraction interferometry, FIG. 14 shows a schematic side view corresponding to FIG. 1 for a measurement device variant with immersion fluid, FIG. 15 shows a schematic side view corresponding to FIG. 4 for a measurement radiation source variant with immersion fluid, and FIG. 16 shows a schematic side view corresponding to FIG. 13 for a measurement device variant with immersion fluid.

FIG. 1 shows a schematic side view of a device for the wavefront measurement of a projection objective 1 of a microlithography projection exposure apparatus, which may be e.g. an apparatus of the scanner type. Here and in the rest of the figures only the components of the measurement device which are of interest in the present case are respectively shown, and said device may, moreover, have further components of conventional type as required. For the sake of simplicity, from the projection objective 1, only an entrance-side lens 9 with associated lens plane 2, an aperture diaphragm 8 and an exit-side lens 10 with associated lens plane 3 are shown in a manner representative of further customary components. In a useful operating mode of the exposure apparatus, wafers are exposed with useful radiation in a customary manner, by means of which radiation the projection objective 1 images a reticle structure onto the wafer. For this purpose, a reticle is introduced into an object plane of the objective 1 and the wafer is positioned in an image plane of said objective. The radiation, e.g. UV radiation, is supplied by an illumination system, from which only an exit-side lens 11 is shown in representative fashion. The region before the entrance-side lens 9 of the objective 1, usually referred to as the object side, thus constitutes a useful radiation entrance side of said objective, and the region behind the exit-side lens 10 usually referred to as the image side, correspondingly constitutes a useful radiation exit side of the objective 1.

The projection objective 1 is illustrated in a measurement operating mode in FIG. 1, for which purpose the components of the measuring device are introduced into the exposure apparatus and/or are integrated into the exposure apparatus. As an alternative, the measuring device may be designed as an autonomous measuring station into which the objective 1 is introduced. The measuring device comprises a measurement radiation source with an associated source-side measurement structure mask 62 and a detector 12 with an associated detector-side measurement structure mask 19 and is designed to pass measurement radiation 80 emerging from the source-side measurement structure mask 62 through the objective 1 in the opposite direction to the useful radiation direction of the useful operating mode mentioned above, that is to say from the image side or useful radiation exit side to the object side or useful radiation entrance side.

For this purpose, the measurement radiation source has a measurement structure support 5, which is positioned on the image side of the objective 1 and bears the source-side measurement structure mask 62 on a front side 60 facing the objective 1. The measurement structure support 5 is positioned in such a way that the source-side measurement structure mask 62 lies in the image plane of the objective 1 the measurement structure mask 62 being operated in transmission and having for this purpose a measurement structure comprising transparent and opaque structure elements in a measurement structure region 4.

The detector 12 is arranged on the object side or useful radiation entrance side of the objective 1 and comprises a detector support 83, which, on a front side facing the objective 1, bears a detector-side measurement structure mask 19 as entrance-side detector element and is positioned in such a way that the detector-side measurement structure mask 19 lies in the object plane of the objective 1. The detector support 83 is formed in plate-type fashion from a transparent material and has a detector element 16 on a rear side. The detector-side measurement structure mask 19 comprises a detector-side measurement structure region 13, onto which the objective 1 images the measurement structure region 4 of the source-side measurement structure mask 62 in order to generate an interference or superimposition pattern which is detected by the detector element 16. This means that the measurement radiation 80 emerging from the source-side measurement structure region 4 passes through the objective 1 in the measurement radiation direction opposite to the useful radiation direction and is incident on the detector-side measurement structure region 13 in order then to be detected by the detector element 16.

For providing the measurement radiation, the measuring device utilizes the existing illumination system 11 of the exposure apparatus, which system is subsequently part of the measurement radiation source. For this purpose, the detector-side measurement structure mask 19 has a strip-type passage region 14 lying outside the detector-side measurement structure region 13, which passage region may alternatively also have a different form. Outside its measurement structure region 13 and its passage region 14, the detector-side measurement structure mask 19 has a light-opaque layer 17. In this way, in the strip-type region outside the detector-side measurement structure region 13, radiation 80a generated by the illumination system 11 can pass through the detector support 83 and in particular through the measurement structure mask 19 via the objective 1 to the measurement structure support 5 of the measurement radiation source. The source-side measurement structure mask 62 is provided with a corresponding passage region 7, which is a strip-type passage region in the example shown and which corresponds in form and position to the image of the detector support passage region 14 generated by the objective 1 and lies outside the source-side measurement structure region 4.

The measurement structure support 5 is formed in plate-type or disc-type fashion according to the shape of a wafer, e.g. with a thickness of approximately 1 mm, so that it can be introduced by way of a wafer stage of the exposure apparatus. Furthermore, the measurement structure support 5 is designed for illuminating the measurement structure region 4 of its measurement structure mask 62 as homogeneously and incoherently as possible with the radiation 80a coupled in on the front side via the passage region 7 of its measurement structure mask 62. For this purpose, the measurement structure support 5 is provided with light-scattering and hence also beam-deflecting layer regions 6 on its rear side 61 over the whole area and also on the front side outside the measurement structure region 4 and the passage region 7 on the inner side of the measurement structure mask 62, which layer regions may be formed e.g. by roughening the surface of a support core on which the measurement structure mask 62 is subsequently produced on the front side. On the exterior side, the measurement structure support 5 is provided with a suitable light-absorbing shielding layer on its rear side 61 and on the front side outside the measurement structure region 4 and the passage region 7 of the measurement structure mask 62. In the interior, the measurement structure support 5 comprises a transparent material. As indicated in FIG. 1, this construction of the measurement structure support 5 effects multiple reflections of the radiation 80a coupled in, whereby the measurement structure region 4 of the source-side measurement structure mask 62 is illuminated in transmission sufficiently homogeneously and incoherently from its rear side. It goes without saying that in alternative embodiments the measurement structure support 5 may also be constructed differently for this purpose, in which case antireflection-coated, mirror-coated, absorbing and/or scattering regions may be provided. Microprism structures and light-diffracting structures can also be used for this purpose.

In the present example, the detector element 16 is formed as a CCD array and enables relatively fast detection. Other optoelectronic detector elements, for example CID units or CMOS units, are possible as an alternative. It is also possible to use a detector element which effects photochemical detection. A covering 15 protects the detector unit 16 on the rear side from direct irradiation with the radiation coming from the illumination system 11.

The device of FIG. 1 is preferably designed for wavefront measurement by means of a shearing interferometry technique, for which purpose the measurement structure region 4 of the source-side measurement structure mask 62 is then formed as a so-called coherence mask having one of the structures customary for this purpose in wavefront sources, while the measurement structure region 13 of the detector-side measurement structure mask 19 is formed as a diffraction grating structure. Given a typical demagnifying scale of the projection objective 1 of e.g. 1:4, the requirements made of the planarity of the diffraction grating are correspondingly lower e.g. by a factor of sixteen than in the case of conventional measurement devices with image-side positioning thereof. The structures of the diffraction grating can likewise be kept larger by a factor of 4, so that they can be written using simpler devices or can be reproduced inexpensively with good quality as simple contact copies from a master original. This is advantageous particularly when the structures of the source-side measurement structure mask 62 can be produced relatively simply even with a decrease in size corresponding to the imaging scale. The detector-side and/or the source-side measurement structure mask 19, 62 can be displaced laterally for the purpose of carrying out the measurement by means of the detector 12 or the structure support 5 being moved, as indicated by double arrows 81, 82 in the figure.

FIG. 2 shows in greater detail an advantageous realization for the detector-side measurement structure mask 19 serving as an entrance-side optical element. In this example, the detector-side measurement structure mask 19 has strip-type passage regions 14 at a distance on the right and on the left of the measurement structure region 13. The measurement structure region 13 is formed as a checkered diffraction grating. The rest of the mask region is covered by the light-opaque layer 17. In an alternative advantageous embodiment which is not shown, the pattern of passage strips 14 and diffraction grating strips 13 shown may be repeated multiply on the detector-side measurement structure mask 19.

FIG. 3 shows a schematic side view of a further device for the wavefront measurement of an optical system, for which system here and in the following examples the projection objective 1 from FIG. 1 is once again considered in a manner representative of arbitrary other optical systems which can be measured by means of the device according to the invention. For the sake of simplicity, in all the figures identical reference symbols have been chosen for functionally corresponding, not necessarily identical elements, an unnecessarily repeated description of such elements being omitted. The device from FIG. 3 has a detector 12a, the functioning of which largely corresponds to that of the detector 12 from FIG. 2. The only difference with respect to the detector from FIG. 2 is that the detector 12a from FIG. 3 does not have a passage region. In the case of the device from FIG. 3, the measurement radiation is radiated in laterally, that is to say transversely with respect to an optical axis 28 of the projection objective 1, in front of a source-side measurement structure mask 62a of a measurement structure support 5a of a measurement radiation source. By means of one or a plurality of measurement radiation conversion devices 21, 22, which can be used individually or in combined fashion as required, the measurement radiation fed in laterally is deflected from the front into a respective passage region 7a, 7b of the source-side measurement structure mask 62a.

For the rest, the measurement structure support 5a from FIG. 3 corresponds to the measurement structure support 5 from FIG. 1. FIG. 3 shows two variants of the measurement radiation conversion devices for suitably deflecting measurement radiation 80b, 80c fed in laterally, to be precise a plane mirror 22 and a right-angled prism 21 which can be used as an alternative or in addition and bears by one cathetus surface on the front side of the measurement structure support 5a and the hypotenuse surface of which is mirror-coated for beam deflection. A positive lens 20 is fixed to the second cathetus surface of the prism and serves for focusing the light for targeted coupling into the measurement structure support 5a by virtue of the focal length of the lens 20 corresponding to the beam path of the light as far as the passage region 7b, which can be kept relatively small in this way.

As in the example of FIG. 1, a customary illumination system of an exposure apparatus may serve as radiation-generating unit of the measurement radiation source, in this case, the radiation supplied by the illumination system being coupled out in front of the objective 1 in a manner not shown and then being fed laterally in front of the measurement structure mask 62a. As an alternative, an autonomous measurement-radiation-generating unit may be used, in which case a relatively simple, cost-effective radiation-generating unit as is customary e.g. in measurement apparatuses for objective alignment may suffice for objective measurement. The measurement structure support 5a is applied on a wafer stage or displacement device 23 for lateral displacement during the shearing interferometry measurement, as symbolized by crossed double arrows 84 in FIG. 3.

FIG. 4 shows a schematic side view of a measurement radiation source which can be used alternatively in FIG. 3 and comprises light being coupled in on a face side. The measurement radiation source from FIG. 4 comprises a measurement structure support 5b, which differs from that in FIG. 3 essentially by virtue of the fact that it is transparent on a face-side coupling-in surface and the laterally fed measurement radiation 80b, 80c is coupled in directly there. For the purpose of better coupling in, two face-side measurement radiation guiding devices 20a, 24 are shown, in turn only one or both of which may be provided. A first device of this type is formed as an optical wave guide 24 led to the coupling-in surface, and a second device is formed by a positive lens 20a fitted to the coupling-in surface as a focusing object. Both devices 20a, 24 couple the measurement radiation laterally into the interior of the measurement structure support 5b, where it is repeatedly reflected, diffracted and/or scattered at the scattering or deflecting surfaces 6 in order to illuminate the measurement structure region 4 homogeneously from behind. In this example, the measurement structure region 4 is formed on an otherwise light-opaque source-side measurement structure mask 62b.

FIG. 5 shows a schematic side view of a variant of a measurement radiation source which comprises light being coupled in on a face side. In this example, the measurement radiation is coupled into a measurement structure support 5c on a face side through the positive lens 20a, which measurement structure support, in contrast to that from FIG. 4, has a right-angled prism 25 fitted in the interior and serving as a beam deflection device, the measurement structure region 4 being situated on the front cathetus surface of said prism. The hypotenuse surface of the prism 25 is formed as a deflection surface 63 which deflects the measurement radiation radiated in on a face side to the measurement structure region 4 if appropriate after multiple reflection, diffraction and/or scattering. The deflection surface 63 may be realized in scattering and/or reflecting fashion.

It should be mentioned at this juncture that the lateral radiation feeding shown in FIGS. 3 to 5 and the measurement structure supports suitable for this purpose can also be used in principle for measurement structure masks which are positioned on the object side in a conventional manner.

FIG. 6 shows a schematic side view of a further variant of a measurement structure support 5d for the measurement radiation source, the measurement radiation 80a being coupled into said support on the front side and said support having a measurement radiation conversion device 26 comprising two beam deflection elements 27, 28. The measurement radiation may be supplied e.g. by an illumination system of the exposure apparatus as in the case of FIG. 1. The measurement structure support 5d has on the front side a measurement structure mask 30 comprising a passage region 7c for coupling in the measurement radiation and, at a distance therefrom, comprising the measurement structure region 4. In the interior of the measurement structure support 5d, there is fitted beneath the passage region 7c a first beam deflection element 27 comprising a beam-deflecting area 27 inclined at 45° relative to the optical axis 28 of the objective. In this case, the beam deflection element 27 may be embodied as in FIG. 5 as a prism having a mirror-coated hypotenuse surface or as a simple mirror, and reflects the measurement radiation to an adjacent region of the measurement structure support 5d with the front- and rear-side scattering and/or reflecting layer regions 6, before it impinges on a subsequent second beam deflection element 18. The latter may be formed like the first beam deflection element 27. The reflective surface of the second beam deflection element 18 is likewise inclined by 45° with respect to the optical objective axis 28 and deflects the measurement radiation to the measurement structure region 4.

FIGS. 7 to 9 show possible variants of the measurement radiation conversion device 26 from FIG. 6 with the basic construction described above. They differ only by the manner in which scattering and/or focusing elements are introduced into the beam path. In the case of a measurement radiation conversion device 26a shown in FIG. 7, a first and a second beam deflection element are realized each in the form of a deflection mirror 27a, 18a comprising an additionally light-scattering surface. FIG. 8 shows a measurement radiation conversion device 26b comprising a scattering transverse wall structure 39 which is provided between the first and second beam deflection elements 27, 18 each in the form of a deflection mirror. FIG. 9 illustrates a measurement radiation conversion device 26c, in the case of which only the second beam deflection element 18a additionally has a scattering surface, and a first lens 37 is situated in the light path in front of the first beam deflection element 27 and a second lens 38 is situated in the light path being the second beam deflection element 18a. Both lenses lie in a plane parallel to the plane of the measurement structure mask 30 and serve as a beam shaping optic. A very high luminous efficiency can be achieved with this exemplary embodiment.

The measurement radiation conversion devices 26, 26a, 26b, 26c shown in FIGS. 6 to 9 can be produced with high precision as quasi-monolithic functional units and be inserted into the measurement structure support 5d individually or in groups. The beam-deflecting areas and further beam-shaping elements may be coated and/or patterned in a suitable manner for optimum utilization of the radiation coupled in. The deflection by means of two beam-deflecting areas is particularly efficient since the light is deflected in a targeted manner in the preferred directions.

FIG. 10 shows a schematic side view of a further, modified device for the wavefront measurement of an optical imaging system, such as the objective 1, comprising a measurement radiation source comprising a source-side measurement structure mask 41 operated in reflection and measurement radiation guiding devices 42. The device has the detector 12a from FIG. 3 on the object side. The source-side measurement structure mask 41 operated in reflection is positioned in an image plane of the objective 1 and fitted on a measurement structure support 40, which can be displaced laterally by means of the displacement unit 23 for measurement purposes. The measurement radiation guiding devices 42 are formed as reflective surfaces in the present case and deflect the radiation fed in laterally from a beam-generating unit (not illustrated) onto the source-side measurement structure mask 41. The measurement radiation guiding devices 42 may additionally have a focusing and/or scattering effect. Moreover, zone plates operated in reflection or transmission may be used for focusing the illumination radiation, which is advantageous particularly in the case of short-wave radiation, such as EUV radiation. It is additionally advantageous if the radiation impinges on the measurement radiation guiding devices 42 at shallow angles of incidence, so that it is deflected with utilization of total reflection. A measurement structure region 43 of the source-side measurement structure mask 41 has first structure regions 44 which scatter the illumination light, and second structure regions 43 which reflect or absorb the illumination light. It is only from the first, scattering structure regions 44 that measurement radiation 80 passes to the objective 1 to be measured. Either the second structure regions 43 absorb the illumination radiation or the latter impinges on said second structure regions at an angle of incidence such that the radiation is reflected at an angle greater than the aperture angle of the objective 1.

FIG. 11 shows a schematic side view of a detector 12b constructed like a reticle and comprising electronic components 50. The detector 12b is positioned between the illumination system 11 and the entrance-side lens 9 of the objective to be measured. The detector 12b has a detector support 51, a detector-side measurement structure mask 19a comprising the measurement structure region 13 and the passage region 14 being provided on that side of said detector support which faces the objective. With regard to the functioning of the detector 12b, reference should be made to the description concerning FIG. 1. On the side facing the illumination system 11, the detector 12b has a detector element 16a, e.g. a CCD array or a flat image recording camera unit, with a shielding 15a against direct radiation from the illumination system 11 and also electronic components 50 which are realized, as indicated in FIG. 11, in a flat design alongside the radiation-sensitive detector element 16a. The electronic components may comprise for example an internal power supply, a data line for the remote data transmission and also an evaluation unit for evaluating the measurement signals of the detector element. The internal power supply may be e.g. a battery, a rechargeable battery or a current-generating unit, e.g. a solar cell unit.

FIG. 12 shows a schematic side view of a further example of a detector 12c which can be used in the measurement device according to the invention on a quartz support 51a. With regard to the functioning of the detector 12c, reference should be made to the description of the detectors in FIGS. 1 and 11. In contrast to the detector 12b shown in FIG. 11, the detector 12c has, on the side facing the objective, a measurement structure mask 19b comprising the measurement structure region 13, but without passage region. The detector 12c is therefore suitable e.g. for use in the device from FIG. 3. The electronic components 50 and also the detector element 16a and the shielding 15a are fitted in the interior of the quartz support 51a. An electronic circuit board 52 in the quartz support 51a serves as a support for the electronic components.

FIG. 13 shows a schematic side view of a further device for the wavefront measurement of an optical imaging system, such as e.g. the objective 1, by means of point diffraction interferometry (PDI). The device from FIG. 13 has a detector 12d on the object side, the construction of said detector largely corresponding to that from FIG. 11, a modified detector-side measurement structure mask 19c comprising PDI detection structure 13a being provided. A source-side measurement structure support 5e in the manner of FIG. 6, but with a modified measurement structure mask 62c and with a measurement radiation conversion device 26d in the manner of FIG. 9, and also a beam-splitting diffraction grating 84 are positioned on the image side. For the functioning of the device, the statements made above with regard to FIGS. 1, 6 and 9 hold true, with the difference that a pinhole is used as the measurement structure region 4a of the source-side measurement structure mask 62c of the measurement structure support 5e and, as shown in FIG. 13 the wavefront emerging from the pinhole structure 4a is split by the diffraction grating 84 into a test specimen wave 80d (solid line), which impinges on a first, larger opening of the PDI detection structure 13a for passage of the test specimen wave 80d, and a reference wave 80e (dashed line), which impinges on a second, smaller pinhole opening of the PDI detection structure 13a in order to be diffracted at this. As in the case of shearing interferometry, the aberration properties of the measured objective 1 can be deduced from the interference pattern between transmitted test specimen wave and diffracted reference wave at the detector element 16a.

As is made clear by the above exemplary embodiments, the device according to the invention may be used in particular for the measurement of projection objectives of microlithography projection exposure apparatuses, it being possible to use the shearing interferometry technique shown in FIG. 1, the point diffraction interferometry technique shown in FIG. 13, a Moiré technique or other conventional wavefront measurement techniques, such as e.g. a wavefront measurement technique of the Hartmann or Shack-Hartmann type. What is particularly advantageous about the invention's use of an inverse measurement radiation direction with respect to the useful radiation direction is that on the object side, in the vicinity of the reticle plane, there is sufficient structural space for the relatively structural-space-intensive detector, while in the vicinity of the wafer plane only limited structural space is available which, however, readily suffices for being able to position a wafer-like, thin source-side measurement structure support there in a space-saving manner.

The problem of the evolution of heat from electronic components of the detector is also reduced since the waste heat of the detector rises and, therefore, apart from possible thermal radiation effects, the evolution of heat of the detector does not adversely affect the imaging properties of the underlying projection objective. Both the detector and the measurement radiation source with its measurement structure support can be integrated into the microlithography projection exposure apparatus or be configured as autonomous units. What is essential is that they can be introduced into the beam path of the projection objective for the purpose of carrying out the wavefront measurement and can be removed from said beam path after the conclusion of the measurement. As an alternative, it is also possible to construct the measurement device as a separate measuring station into which the projection objective or any other optical system to be measured can be brought for measurement.

The invention furthermore comprises the possibility of performing the optical measurement using an immersion fluid, for which purpose the latter may be introduced in particular in the measurement radiation source and/or adjacent to the latter and/or in the detector and/or adjacent to the latter. This is explained in an exemplary fashion and in a manner representative of further possible realizations on the basis of three examples.

Thus, FIG. 14 shows a device variant which, apart from the immersion fluid application, corresponds to the device from FIG. 1, to which reference may for the rest be made, and identical reference symbols being used for identical or functionally equivalent elements. FIG. 14 shows the measurement operating mode for a projection objective 1', which terminates with a planar termination plate 10' on the exit side, in which case the terminating objective element may alternatively also be some other optical component, such as a lens element. An interspace 90 between said terminating element 10' of the objective 1' and a subsequent measurement structure support 5' is formed as an immersion fluid chamber using a circumferential seal 91, e.g. a bellows-type seal. An immersion fluid can be fed into said chamber via an inlet 92, as indicated by arrows. On an opposite side to the inlet 92, the immersion fluid is discharged from the immersion fluid chamber 90 via an outlet 93. In the example shown the inlet and outlet lines 92, 93 lead through the measurement structure support 5' on a respective face side thereof. Provision may be made as required for filling the immersion fluid chamber 90 with the immersion fluid and then keeping the latter therein or alternatively maintaining a continuous immersion fluid flow through the immersion fluid chamber 90. Means for controlling the temperature of the immersion fluid outside or within the immersion fluid chamber 90 are optionally provided. For this purpose, there may also be means for measuring the temperature and if necessary for regulating the temperature of the immersion fluid, e.g. integrated into the measurement structure support 5'.

The measurement structure support 5' may comprise a transparent material as in the example of FIG. 1 or alternatively be formed with formation of a cavity 94 between its front side 60 and its rear side 61, into which cavity immersion fluid can then likewise be introduced. For this purpose, said cavity 94 of the measurement structure support 5' may, as required, be in fluid connection with the immersion fluid chamber 90 between objective 1' and measurement structure support 5' to form a common immersion fluid chamber, or else may form a second immersion fluid chamber separately from this. The use of immersion fluid has the known advantages; in particular it is possible to provide a very high-aperture illumination of the objective 1' to be tested with the measurement structure region 4 from the image side of the objective 1'.

FIG. 15 correspondingly shows a realization variant for the arrangement of the measurement structure support 5b from FIG. 4 in which an interspace 96 between the exit-side element 10 of the optical system to be tested and the measurement structure support 5b is formed as an immersion fluid chamber by a circumferential seal 95, such as a bellows-type seal. A suitable immersion fluid can be introduced into said chamber by customary means (not specifically shown). With regard to further measures relating to the immersion fluid and advantages or properties achieved therewith, the statements made above concerning FIG. 14 hold true in the same manner not explicitly illustrated in FIG. 15, to which reference may be made.

FIG. 16 analogously shows an immersion fluid variant of the device from FIG. 13, in which case once again only the modifications relating to the immersion fluid need be discussed at this juncture, while for the rest reference may be made to the above statements concerning FIG. 13, and in this respect identical reference symbols are used. In the example of FIG. 16, an interspace 97 between the exit-side component 10 of the objective 1 to be tested and the measurement structure support 5e is once again formed as an immersion fluid chamber using a circumferential seal 98, such as a bellows-type seal. Associated with this, provision is made of means for feeding in and discharging the immersion fluid, e.g. as a continuous fluid flow, and if necessary means for measuring and regulating the fluid temperature. In this regard and with regard to the further possible modifications, advantages and properties of using an immersion fluid, reference may be made to the above statements concerning FIGS. 14 and 15 and to the prior art mentioned in the introduction.

It goes without saying that means for introducing an immersion fluid may also be provided in the same way for the remaining exemplary embodiments shown and described above. Moreover, such means may be provided in the same way on the detector side in addition or as an alternative to the presence at the measurement radiation source as described above with reference to FIGS. 14 to 16; that is to say that an immersion fluid can be introduced into a detector component or adjacent thereto in an analogous manner, e.g. into a detector support or an interspace between the latter and the optical system to be tested, which does not require more detailed explanation.

The invention claimed is:

1. A device for the optical measurement of an optical system which, in a useful operating mode, receives useful radiation on a useful radiation entrance side and emits it on a useful radiation exit side, comprising:
   a measurement radiation source, by which at least one exit-side element which emits measurement radiation to the optical system can be positioned on the useful radiation exit side of the optical system, and
   a detector, by which at least one entrance-side element which receives measurement radiation coming from the optical system can be positioned on the useful radiation entrance side of the optical system,
   wherein at least one of the following conditions are met: (a) the measurement radiation source comprises a source-side measurement structure mask for positioning on the useful radiation exit side, and (b) the detector comprises a detector-side measurement structure mask for positioning on the useful radiation entrance side.

2. The device as claimed in claim 1, wherein the measurement radiation source is designed for the rear-side illumination of the source-side measurement structure mask, the source-side measurement structure mask is designed for operation in transmission, and the measurement radiation source comprises a measurement radiation conversion device in the beam path of the measurement radiation upstream of the source-side measurement structure mask.

3. The device as claimed in claim 2, wherein the measurement radiation conversion device has at least one of: at least one light-deflecting element and at least one light-scattering element.

4. The device as claimed in claim 1, wherein the measurement radiation source comprises a beam-generating unit for positioning on the useful radiation entrance side and the detector-side measurement structure mask has, outside a measurement structure region, a passage region for the measurement radiation.

5. The device as claimed in claim 1, wherein the source-side measurement structure mask has a passage region outside a measurement structure region in order to pass through measurement radiation emitted by a beam-generating unit for the rear-side illumination of the measurement structure region.

6. The device as claimed in claim 1, wherein the measurement radiation source is designed for the front-side illumination of the source-side measurement structure mask, the source-side measurement structure mask being designed for operation in reflection.

7. The device as claimed in claim 6, wherein a measurement structure region of the source-side measurement structure mask has scattering regions and has at least one of reflecting and absorbing regions.

8. The device as claimed in claim 1, wherein the measurement radiation source has a measurement radiation guiding device for laterally feeding the measurement radiation emitted by a beam-generating unit into a region in front of or behind the source-side measurement structure mask.

9. The device as claimed in claim 1, wherein the detector has a detector support arranged on the useful radiation entrance side of the optical system, said detector support bearing the detector-side measurement structure mask and a detector element arranged downstream of the measurement structure mask.

10. The device as claimed in claim 9, wherein the detector support bears a detector power supply unit.

11. The device as claimed in claim 1, wherein an immersion fluid is introduced into or adjacent to at least one of the measurement radiation source and the detector.

12. A measurement structure support for an optical measurement device, comprising:
a transparent support body, on the front side of which is provided a measurement structure mask which is operable in transmission and comprises a measurement structure region and into which is integrated a measurement radiation conversion device for the rear-side illumination of the measurement structure region, and
a passage region coupling measurement radiation into the support body provided on a face side of the measurement structure support, the face side being on at least one of:
(a) a front side outside the measurement structure region of the measurement structure mask, and (b) a rear side.

13. The measurement structure support as claimed in claim 12, wherein the measurement radiation conversion device comprises at least one of reflecting and light-scattering regions on or in at least one of: (a) the front side of the support body, (b) the rear side of the support body, and (c) the interior of the support body.

14. The measurement structure support as claimed in claim 12, wherein the measurement radiation conversion device has, below the measurement structure region, a first beam-deflecting area for deflecting the measurement radiation onto the rear side of the measurement structure region.

15. The measurement structure support as claimed in claim 14, wherein the measurement radiation conversion device comprises a second beam deflecting area for deflecting measurement radiation incident on at least one of the front side and the rear side at a passage region into the measurement structure support onto the first beam-deflecting area.

16. The measurement structure support as claimed in claim 12, wherein the measurement radiation conversion device comprises a beam-shaping optic.

17. The measurement structure support as claimed in claim 12, configured to receive and contain an immersion fluid.

18. The device as claimed in claim 1, further comprising:
a measurement structure support, comprising:
a transparent support body, on the front side of which is provided a measurement structure mask which is operable in transmission and comprises a measurement structure region and into which is integrated a measurement radiation conversion device for the rear-side illumination of the measurement structure region, and
a passage region coupling measurement radiation into the support body provided on a face side of the measurement structure support, the face side being on at least one of:
(a) a front side outside the measurement structure region of the measurement structure mask, and (b) a rear side.

19. The device as claimed in claim 1, designed for wavefront measurement of a lithography projection objective, wherein at least one of: (a) the source-side measurement structure mask is arranged on an image side of the projection objective, and (b) the detector-side measurement structure mask is arranged on an object side of the projection objective, and wherein the detector detects an image of the source-side measurement structure mask or a superimposition pattern of the image of the source-side measurement structure mask with the detector-side measurement structure mask.

20. The device as claimed in claim 19, designed for a wavefront measurement utilizing a shearing interferometry technique or a point diffraction interferometry technique or a Moire superimposition technique.

21. A microlithography projection exposure apparatus, comprising the device as claimed in claim 19.

22. The microlithography projection exposure apparatus as claimed in claim 21, configured as a scanner type exposure apparatus.

23. The microlithography projection exposure apparatus as claimed in claim 21, further comprising a common radiation generating unit or a dedicated radiation generating unit, for providing the useful radiation and the measurement radiation.

24. A method for the optical measurement of an optical system which, in a useful operating mode, receives useful radiation on a useful radiation entrance side and emits the radiation on a useful radiation exit side, said method being performed with measurement radiation in a measurement operating mode and comprising:
at least one of: (a) positioning a source-side measurement structure mask of a measurement radiation source on the useful radiation exit side and (b) positioning a detector-side measurement structure mask of a detector on the useful radiation entrance side, and carrying out a measurement operation by emitting measurement radiation provided by the measurement radiation source to the optical system on the useful radiation exit side and receiving measurement radiation coming from the optical system on the useful radiation entrance side for detecting the radiation.

* * * * *

UNITED STATES PATENT AND TRADEMARK OFFICE
CERTIFICATE OF CORRECTION

PATENT NO. : 8,004,690 B2  
APPLICATION NO. : 10/585402  
DATED : August 23, 2011  
INVENTOR(S) : Ulrich Wegmann Page 1 of 1

It is certified that error appears in the above-identified patent and that said Letters Patent is hereby corrected as shown below:

Column 7, line 24: after "simply" insert -- even --

Column 7, line 24: delete "imagining" and insert -- imaging -- therefor

Column 19, line 2: in Claim 24, delete "side ,and" and insert -- side, and -- therefor Signed and Sealed this  
Thirteenth Day of November, 2012

David J. Kappos  
*Director of the United States Patent and Trademark Office*